United States Patent [19]
Löhn et al.

[11] 3,939,429
[45] Feb. 17, 1976

[54] TUNABLE HIGH FREQUENCY INPUT CIRCUIT FOR A TELEVISION RECEIVER THAT TUNES BOTH VHF AND UHF CHANNELS AND CAN BE READILY INTEGRATED

[75] Inventors: Klaus Löhn, Johberg, Belgium; Georg Lütteke; Gerd Schiefer, both of Aachen, Germany; Lammert Bruntink, Eindhoven, Netherlands; Paulus Petrus Maria Groenewegen, Eindhoven, Netherlands; Hans Viktor Weinerth, Eindhoven, Netherlands; Wilhelmus Antonius Joseph Marie Zwijsen, Eindhoven, Netherlands; Karel Petrus Van Rooij, Eindhoven, Netherlands

[73] Assignee: U.S. Philips Corporation, New York, N.Y.

[22] Filed: July 2, 1974

[21] Appl. No.: 485,203

[30] Foreign Application Priority Data
July 7, 1973 Germany............................ 2334570

[52] U.S. Cl................................. 325/432; 325/453
[51] Int. Cl.² ............................................. H04B 1/26
[58] Field of Search .......... 325/308, 432, 433, 436, 325/437, 439, 442, 445, 446, 443, 450, 451, 453, 460; 333/82 R, 82 A, 84 M; 329/166

[56] References Cited
UNITED STATES PATENTS

| | | | |
|---|---|---|---|
| 3,534,267 | 10/1970 | Hyltin ................................. | 325/445 |
| 3,639,840 | 2/1972 | Shekel et al. ........................ | 325/308 |
| 3,801,915 | 4/1974 | Ostuni et al. ........................ | 325/432 |
| 3,838,367 | 9/1974 | Bex ..................................... | 325/445 |

*Primary Examiner*—Albert J. Mayer
*Attorney, Agent, or Firm*—Frank R. Trifari; Henry I. Steckler

[57] ABSTRACT

The IC television tuner has a tunable oscillator and a fixed oscillator, two mixer stages and a filter in between. This tuner operates at two intermediate frequencies the first of which lies in the GHz range. The two oscillators are coupled through hybrid rings.

20 Claims, 9 Drawing Figures

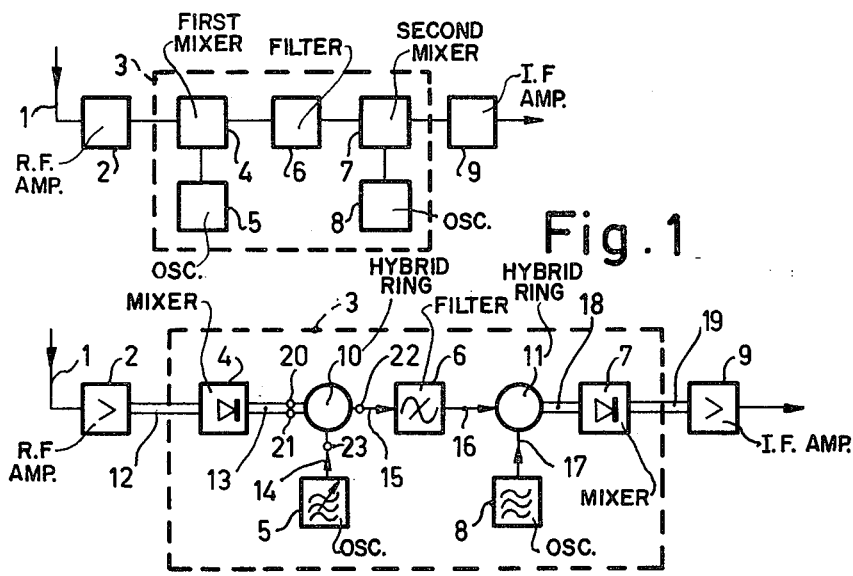
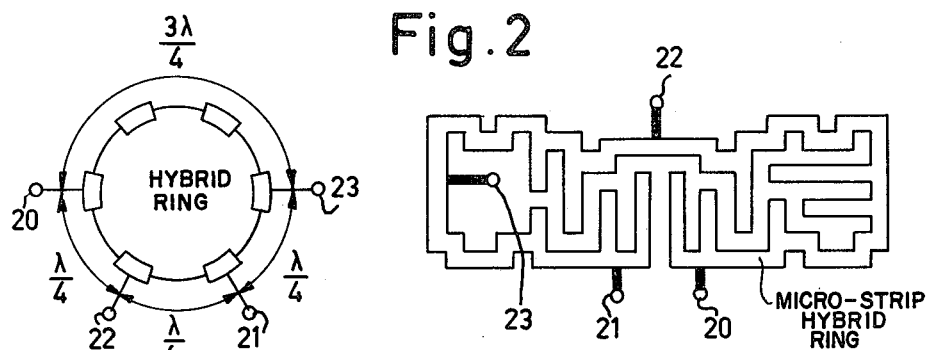
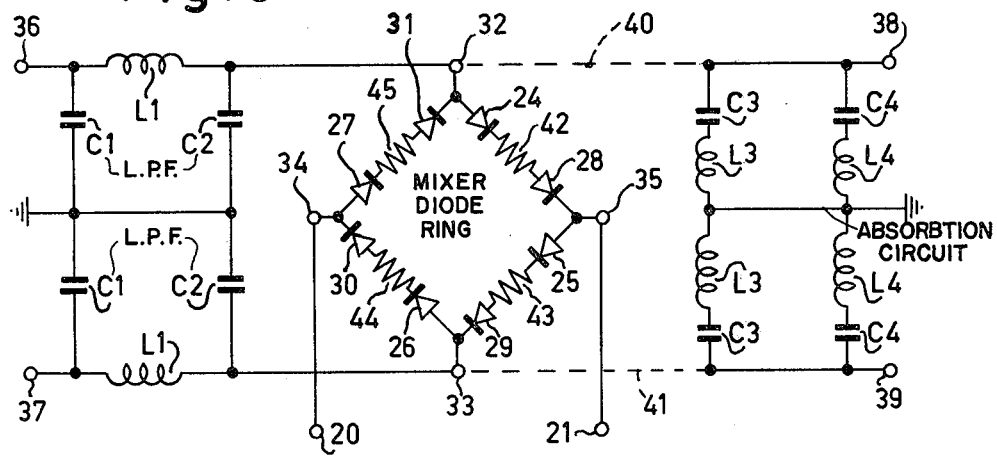

TUNABLE HIGH FREQUENCY INPUT CIRCUIT FOR A TELEVISION RECEIVER THAT TUNES BOTH VHF AND UHF CHANNELS AND CAN BE READILY INTEGRATED

The invention relates to a tunable high frequency input circuit for a television receiver suitable for the reception of television signals in the VHF and/or the UHF range in which circuit the television signal with the desired reception frequency is filtered out and brought to the required intermediate frequency by means of a tuning oscillator in a mixer behind a preamplifier stage which is common for all ranges, said television signal being available at the output of said input circuit.

Such known tunable high frequency input circuits are also denoted as tuners and consist mainly of a so-called high frequency circuit or a high frequency amplifier stage and a mixer stage. An embodiment is the presently commercially available channel selector built in the apparatus made by the Applicant which selector consists in these apparatus of two separate units, namely one channel for the reception of television signals in the UHF range and the other for the reception of television signals in the VHF range. The two channel selectors mainly consist of an input stage which in this embodiment is formed for a narrow band. However, there are also other embodiments in which a further transistorized stage having a so-called aperiodic preamplifier is arranged before this input stage. As is common practice in the radio reception technique the channel selectors or tuners of the television receivers are equipped with mainly two or more resonant circuits having discrete elements at least one of which must be variable in value. Whereas in prior applications variable capacitors were used to vary the frequency determining capacitance in the high frequency circuits, the inductance was later varied by movable cores. Recently it has become however, again the capacitance which is varied as frequency determining element in the resonant circuit because variable capacity diodes can be built in in a very simple manner in the high frequency circuits and only a voltage variation varies the capacitance of such diodes which are used in the blocking range. In this manner it is very easy to tune the relevant resonant circuit. A drawback of this conventional apparatus is, however, that the so-called high frequency resonant circuit and the so-called oscillator circuit must be tuned simultaneously and equally so that strict requirements are imposed on the precision of the tuning curves, i.e. as a function of the tuning voltage the capacitances of the variable capacity diodes in the high frequency circuit and in the oscillator circuit must be equally varied relatively to each other, or else tracking differences and hence unwanted modulation products in the mixer stage are produced.

A further drawback of channel selectors constructed in this manner is that the separate elements are formed as discrete structural elements, i.e. transistors, resistors, coils and capacitors as well as the tuning diodes are to be arranged separately as discrete structural elements while the circuit-capacities must of course be taken into account. However, since small changes in position of a structural element result in very large differences in the circuit capacity it would be desirable to change over to other production methods in this case too.

Thus this invention had for its object to provide a channel selector or tuner or generally a tunable high frequency input circuit for a television receiver which is eminently suitable for mass production. To achieve this object the experiences of the complete high frequency technique were available for those skilled in the art, particularly the steps which were used partly in the measuring apparatus technique and the steps used in the field of the so-called integrated switching technique. It was, however, difficult to provide a solution which on the one hand is adapted to the requirements for the channel selectors of a television receiver and does not present further difficulties relative to the production, but actually results in a simplification and furthermore provides a structural element which can be remotely tuned in such a manner as is now common practice in television receivers, i.e. for example, simple use of the so-called technique of preset transmitter tuning.

The starting point is a tunable high frequency input circuit for a television receiver suitable for the reception of television signals in the VHF and/or UHF range, which receiver may have, for example, a preamplifier giving a common amplification for all ranges, and a tunable oscillator circuit. A large frequency band of television signals from the aerial is present at the input of this so-called channel selector and the desired intermediate frequency must appear at the output which is further amplified in a conventional manner in intermediate frequency stages. The latter does not, however, form part of the invention.

The above-mentioned object is achieved in a tunable high frequency input circuit for a television receiver according to the invention in that the mixer consists of two mixer stages, two oscillators and a gyromagnetic filter, for example, a YIG filter while the first mixer stage converts the desired reception frequency by means of a first tunable oscillator by mixing up to a first intermediate frequency band located above the upper limit of the range from which the gyromagnetic filter only filters out a first intermediate frequency and of which the second mixer stage converts the first intermediate frequency by means of a second fixed frequency oscillator down to a second intermediate frequency located below the lower limit of the range.

For the further elaboration of the invention each component in this novel television channel selector must be specially adapted and the characteristic features of the further claims state one or more embodiments for further elaboration of the invention.

The advantage of the circuit according to the invention is that the difficulties which have hitherto occurred due to the so-called tracking problems in the channel selectors are no longer present because only a single element, i.e. a single oscillator must be tuned. Since in addition a conversion to a very high intermediate frequency is effected, the components may be proportionally small. The total so-called conductor plate for the channel selector may have maximum dimensions of approximately 2 to 6 sq.cm. and the most important advantage of the circuit is that the separate components are no longer formed as discrete structural elements, but the greater part of the structural elements is manufactured in accordance with the so-called IC technique, i.e. the most important parts of such a channel selector may be made automatically.

Embodiments of the invention are further shown in the drawings and will be hereinafter described in greater detail.

FIG. 1 shows a block schematic diagram of a channel selector according to the invention.

FIG. 2 shows a further detail of the block schematic diagram according to FIG. 1.

FIG. 3 shows an embodiment of a hybrid ring according to the invention with its connections.

FIG. 4 shows an embodiment of a hybrid ring in the thin film technique.

FIG. 5 shows the diode ring for the mixer stages with the associated circuits.

Figure 6:
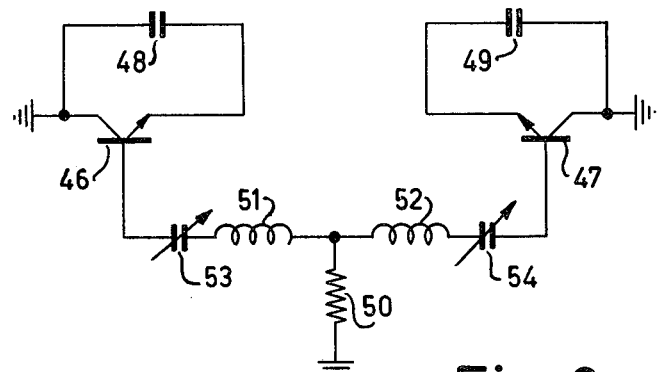
FIG. 6 shows an embodiment of the tuning oscillator.

FIG. 1 diagrammatically shows the tunable high frequency input circuit or channel selector according to the invention. Reference numeral 1 denotes the aerial supply line, 2 is an input broadband amplifier, which is formed for example for the range of 47 to 960 MHz.

The most important parts of this invention are shown in FIG. 1 in the box within broken lines denoted by the reference numeral 3, namely a first mixer stage 4 with the associated tuning oscillator 5 for the frequency of, for example, 2040 to 2953 MHz. This first mixer stage 4 is followed by a filter 6 for the first intermediate frequency at approximately 3000 MHz. The filter precedes the second mixer stage 7 which is connected to a fixed oscillator 8 oscillating at, for example, the frequency of 3035 MHz and the output of the second mixer stage 7 precedes the second intermediate frequency stage or the conventionally used intermediate frequency stage of a television recevier. This stage is denoted by 9 and as is known the intermediate frequency is 35 MHz.

In the first mixer stage the desired reception frequency is converted up to a first intermediate frequency band located above the upper limit of the range with the aid of the first tunable oscillator. The filter connected for the first intermediate frequency, i.e. filter 6, passes a certain bandwidth in the vicinity of the high first intermediate frequency and the second mixer stage 7 connected to the fixed frequency oscillator 8 is intended to convert the first very high intermediate frequency, i.e. the intermediate frequency in the GHz range down to the second intermediate frequency located below the lower limit of the range.

The total arrangement of the channel selector according to this invention thus has the properties as already mentioned and in addition, as is apparent from the description of the separate components, it has also the advantage that no mirror frequencies occur in the reception band. This is why operation without input selectivity, thus without a tunable input filter is possible. No problems relating to tracking exist and hence the provision of controlling or trimming elements may be avoided.

The tuning range of the tuning oscillator is relatively small due to the introduction of the high intermediate frequency so that all ranges can be tuned without band conversion with a single oscillator, i.e. the channel selector according to the invention may be continuously tunable from the VHF band up to the highest UHF band All inductors and capacitors are so small that they can be realized by the microwave IC technique so that miniaturization and a decrease in costs can be realized.

FIG. 2 shows the separate elements in greater detail in which the reference numeral 1 denotes the aerial supply line and 2 denotes the input broadband amplifier for the frequencies of, for example, 47 to 960 MHz. However, this input broadband amplifier 2 is formed in such a manner that instead of an asymetric output — as hitherto common practice — a symmetric output leads from this amplifier to the first mixer stage 4 and this symmetric output is denoted by 12 in FIG. 2. Thus the input frequency $f_e$ is applied in balance to the first mixer stage 4. However,, the signal also leaves the first mixer stage 4 symmetrically instead of asymmetrically through the line 13 to a so-called first hybrid ring denoted by 10. This first hybrid ring is connected through lead 14 to the tuning oscillator 5 which can be tuned, for example, to the frequency of from 2040 to 2953 MHz. The tuning oscillator frequency $f_A$ reaches through lead 14 the first hybrid ring 10 and the tuning oscillator frequency $f_A$ on the symmetric line circuit 13 is an odd mode, while the first intermediate frequency, i.e. at approximately 3000 MHz is in an even mode. The first intermediate frequency leaves the first hybrid ring 10 through the lead 15 in FIG. 2 and then reaches a YIG filter, i.e. the filter 6 for the first intermediate frequency of 3000 MHz. An asymmetric lead namely lead 16 is present behind this YIG filter where only the narrow filtered out first intermediate frequency band of for example 3000 MHz ± 3 MHz is present and reaches the second hybrid ring 11 through the lead 16. This hybrid ring 11 is connected through an asymmetric lead 17 to a fixed frequency oscillator 8. This fixed frequency oscillator 8 oscillates at for example the frequency of 3035 MHz. The fixed oscillator frequency $f_o$ reaches the hybrid ring 11 through the asymmetric lead 17. This ring receives through lead 16 the first intermediate frequency of for example 3000 MHz and the fixed oscillator frequency $f_o$ is applied in an odd mode through lead 18 from the second hybrid ring 11 and the first intermediate frequency is applied in an even mode to the second mixer stage 7. From the stage the second intermediate frequency in the order of 35 MHz reaches in an odd mode the second intermediate frequency stage through the symmetric lead 19. This stage is likewise denoted by 9 in FIG. 1 and has a symmetric input in this embodiment adapted to the invention and an asymmetric output. This asymmetric output is connected to the conventionally used intermediate frequency stages in television receivers, namely the further intermediate frequency stages.

The further Figures show embodiments for the separate components of the parts of the invention shown within the box 3 denoted by broken lines in FIGS. 1 and 2.

FIG. 3 shows the hybrid ring. Firstly the subdivision is important because the hybrid ring is formed in principle in such a manner that 6/4 λ are realized on the circumference, hence over 360°. (λ is the wavelength relating to the centre of the tuning range of the oscillator 5, thus approximately 2.5 GHz). The connection terminals of this hybrid ring are shown in FIG. 2 for the first hybrid ring 10. The first mixer stage 4 is connected to the connection terminals 20 and 21, i.e. the symmetrical input of the hybrid ring 10, which means that the symmetric output of the first mixer stage 4 at the terminals 20 and 21 is λ/2 apart. The asymmetric output of the first hybrid ring 10 with the terminal 22 is located between the two connection terminals, so this is lead 15 passing to the filter 6 for the first intermediate frequency. This connection is located in the centre between the two terminals 20 and 21 hence of equal distances of λ/4. The connection for the tuning oscillator to the terminal 23, also an asymmetrical lead, is shifted over λ/4 relative to connection terminal 21 and over 3/4 λ relative to terminal 20.

This circuit is known per se (see for example Meinke-Gundlach: Taschenbuch der Hochfrequenztechnik, Springer 1962, Kap.E 14) as a replacement of a differential transmitter in the microwave technique, i.e. for separating signals having equal and opposite phases.

The hybrid ring according to FIG. 3 may consist of separate line sections with a uniform wave resistance, or each line section of the hybrid ring may be formed as a $\pi$ or as a T element of concentrated inductors and capacitors or as high impedance or low impedance line sections as is shown in FIG. 3. Such steps serve to reduce resonances of the higher harmonics in the hybrid ring.

A further embodiment of such a hybrid ring 10 or 11 according to FIG. 2 is shown in FIG. 4. FIG. 4 shows an embodiment in a micro-strip technique in which the shifts over the given distances as can be seen from FIG. 3 are taken into account. Such an arrangement has the advantage of the very small and space-saving construction.

FIG. 5 shows a known diode ring arranged as a mixer stage for the mixer stage 4, hence for the first mixer stage and for the mixer stage 7, hence for the second mixer stage. The diode ring itself in principle always consists of four diodes 24, 25, 26 and 27 as arranged in FIG. 5. The example shown is a special and further elaborate embodiment because two diodes are arranged after each other in each branch while the branch of the diode 24 accommodates a second diode 28, the branch of the diode 25 accommodates as a second diode the diode 29, the branch of the diode 26 accommodates the diode 30 and the branch of the diode 27 accommodates the diode 31. The diode ring is formed in such a manner that all mixing products which are not produced by odd harmonics of the input signal and of the oscillator frequency are suppressed in these so-called balanced mixers. Such mixers are known and necessary when there is no input selection. Due to the extra diodes 28 to 31 and the optional extra resistors 42 to 45 (FIG. 5) the mixer can process larger signals.

This diode ring has the connections 32, 33, 34 and 35. The left-hand part of FIG. 5 shows the arrangement of such a diode ring for use of the first mixer stage 4. The terminals 32 and 33 are connected through a lowpass filter to the symmetrical output of the input broadband amplifier which might thus be connected to the terminals 36 and 37. Such a lowpass filter consists of for example a $\pi$ element with the capacitors $C_1$ and $C_2$ where $C_1$ and $C_2$ have approximately a value of 5 pF and with an inductor $L_1$ of approximately 9 nH.

As regards the diode ring it may be noted that each branch between the two diodes accommodates resistors, in this case denoted by the reference numerals 42 to 45. These resistors have for example values of 1 to 30 ohms and the effect that relative to simple diode rings larger signals can be processed at the same cross modulation performance. Such steps are important when there is no input selection because adjacent transmitters in the mixer may become more strongly apparent than the desired useful transmitter. Due to the choice of these resistors 42, 43, 44 and 45 the minimum cross modulation can be adjusted for a given oscillator power.

The lowpass filter consisting of the capacitors $C_1$, $C_2$ and the inductor $L_1$ must reflect the symmetrical first intermediate frequency hence that at 3000 MHz and not freely pass it to the input broadband amplifier and in addition this filter must keep the high oscillator voltage of the tuning oscillator 5 away from the output of the input broadband amplifier 2.

For use in the first mixer stage 4 the terminals 34 and 35 of the diode ring are connected to the terminals 20 and 21 as is shown in FIGS. 2 and 3, respectively.

The right-hand part of FIG. 5 shows by way of example an arrangement for use of such a diode ring as a second mixer stage 7. Here the terminals 32 and 33 are connected to an absorption circuit for the first intermediate frequency of 3000 MHz and a second absorption circuit for the frequency of the fixed oscillator $f_o$ and from there they lead to the symmetrical input of the second intermediate frequency stage at 35 MHz denoted by 9 in the FIGS. 1 and 2. This stage is connected to terminals 38 and 39.

When the diode ring shown in FIG. 5 is used in the second mixer stage 7, the connections or connection leads 40 and 41 denoted by broken lines on the right-hand side are used, and on the left-hand side, as shown in FIG. 5, there are no line connections so that the connections denoted by 20 and 21 at the bottom of FIG. 5 serve as the two connection terminals to the lead 18 for the second hybrid ring 11 analogously as for the connections for the first hybrid ring 10. The absorption circuit for the first intermediate frequency at 3000 MHz, as shown in the right-hand part of FIG. 5 by $L_3C_3$ consists in practice of an open line section with the electrical length of 25 mm (λ/4 at 3000 MHz). The second absorption circuit $L_4C_4$ for the frequency $f_o$, hence for the fixed oscillator frequency consists of a corresponding open line section of λ/4 at the oscillator frequency.

The two absorption circuits prevent said frequencies from passing to the second intermediate frequency stage 9. In addition in case of correct proportioning effects may occur which may be substantially considered as a reflexion of these signals into the second diode mixer, i.e. the second mixer stage 7.

FIGS. 6, 7, 8 and 9 show oscillators which can be used either as tuning oscillators 5 or as fixed oscillators 8 in the circuit arrangements according to the invention.

FIG. 6 shows a principle circuit diagram of a tunable microwave pushpull transistor oscillator with transistors 46 and 47 whose collector-emitter-paths are shunted for feedback by capacitors 48 and 49. The load resistor is denoted by 50 and the actual oscillator circuit consists of the inductors and coils 51 and 52 which may have a value of approximately 10 nH and the variable capacitors 53 and 54 which can be varied between approximately 10 and 1½ pF.

The following aspects have to be taken into account: microwave circuits that can be integrated consist of discrete semiconductor chips, thin film metal structures and discrete passive elements, if any, which are provided on a low-loss substrate. Such novel circuit techniques should also be realized for this oscillator. The oscillator is a higher harmonic oscillator where only the first higher harmonic produced by non-linearities, thus the second harmonic, is coupled out on the output. In the pushpull oscillator according to FIG. 6 the two currents flow in the branch comprising capacitor 53 and inductor 51 to the branch comprising capacitor 54 and inductor 52 with a phase shift of 180°. When these two currents are separated in accordance with their harmonics, it is found that the odd harmonics are always in opposite phase and the even harmonics always have the same phase. When the load 50 is connected to the point shown, the even harmonics can flow therethrough with an equal phase while the odd harmonics eliminate each other. However, since the amplitude of the second harmonic or of the first higher harmonic is much larger than that of the other even harmonics, this harmonic is preferably coupled out.

Figure 7:
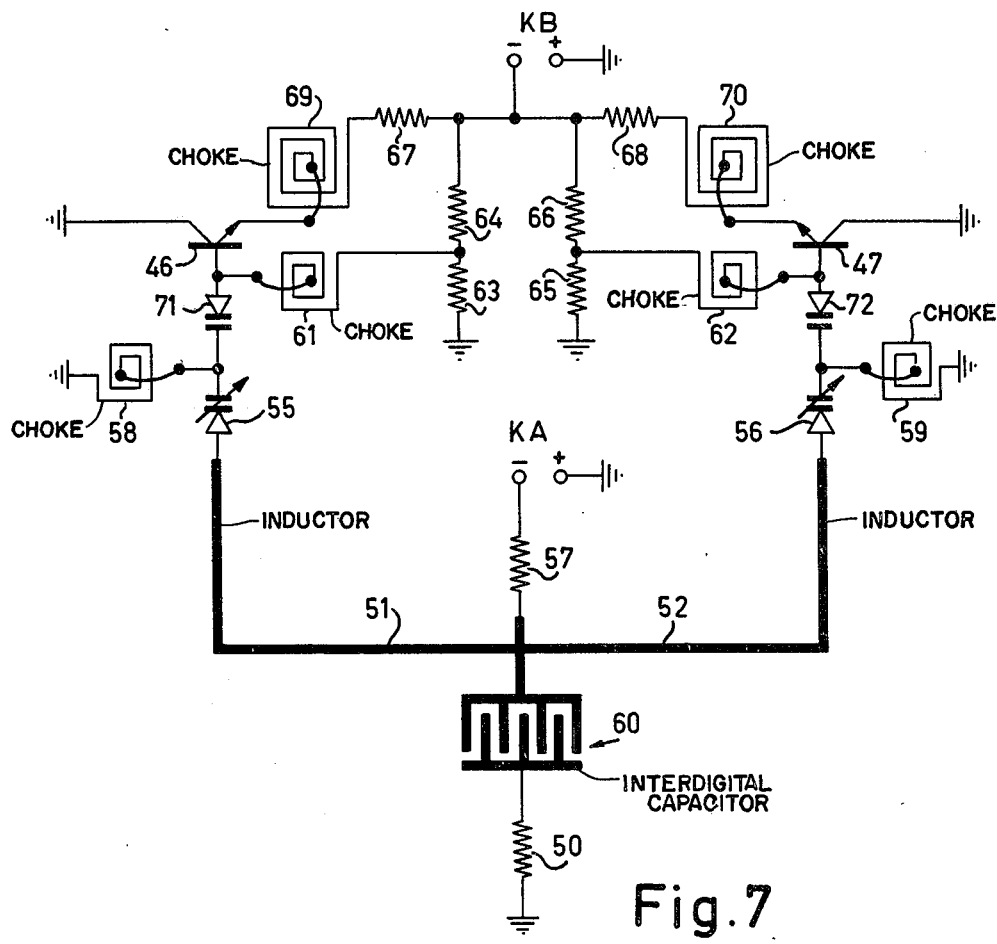
FIG. 7 shows a further elaborated embodiment of the tuning oscillator according to FIG. 6.

A further improvement and an actual realization of the circuit arrangement according to FIG. 6 is shown in FIG. 7 in a completely integrated form. The variable capacity diode which can be varied by the tuning voltage serves as a tuning capacitor which is denoted by 55 in one oscillator branch and by 56 in the other. These diodes may alternatively be replaced by for example the push-pull circuit or the series circuit of two separate diodes. The inductors 51 and 52 are constituted by thin film strips or thin film spirals or by a piece of strip lead. The supply of the diode voltage (KA) to these variable capacity diodes 55 and 56 is effected through a resistor 57 and the two thin film chokes 58 and 59. These chokes 58 and 59 may alternatively be replaced by resistors having a sufficiently high value. To avoid the shunt of the variable capacity diodes 55 and 56 through the load resistor or through the load 50 and for a better matching of this load an interdigital thin film capacitor 60 is included.

The thin film chokes 61 and 62 at the bases of the transistors 46 and 47 have a high micro-wave impedance and only separate the actual oscillator section from the supply section for the transistor, i.e. from the resistors 63, 64, 65 and 66 as well as 67 and 68. The thin film coils 69 and 70 accommodated in the emitter supply line of the transistors 46 and 47 are formed in such a manner that they constitute the capacitors 48 and 49 of FIG. 6 with the aid of their parasitic capacitance relative to ground and on the other hand fulfil a separating function due to their high impedance likewise as the base coils 61 and 62. Further capacity diodes 71 and 72 having values of approximately 30 pF are present between the transistors 46 and 47 and the variable capacity diodes 55 and 56. These diodes thus have relatively higher capacitances and hence a small micro-wave impedance. These capacity diodes 71 and 72 are biassed by the base voltage of the transistors 46 and 47 and operate as isolation capacitors for maintaining the transistor potential and the potential of the capacity diodes independent of each other.

In one embodiment transistors BFW 16 are arranged. The oscillator operates in the frequency range between 2 and 3 GHz with output powers of more than 100 mW. For the capacity diodes 55 and 56 for example the types BB 105 were used. The great advantage of this arrangement is that with the aid of capacitively acting DC conveying thin film coils as well as by the use of potential-separating capacity diodes a push-pull microwave oscillator is obtained which can be constructed completely in accordance with the integrated circuit technique and therefore has extremely small dimensions. All extra semiconductors, i.e. the discrete structural elements may be combined in a single chip. The circuit arrangement can be formed in such a manner that it need not be adjusted at a later stage and it is therefore specially suitable for mass production in an integrated technique.

Figure 8:
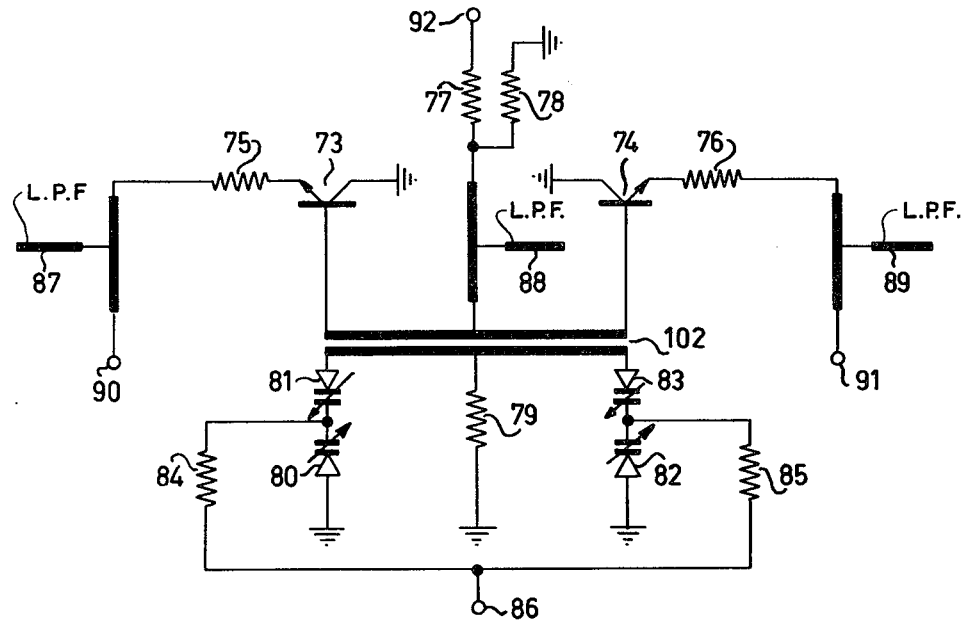
FIG. 8 shows a further embodiment of a tuning oscillator.

FIG. 8 shows a further embodiment of a higher harmonic oscillator in which a micro-wave oscillator is shown which can be tuned between 2 and 3 GHz and can be completely integrated based on the use of so-called coupled leads and capacity diodes.

Among the possibilities of building tunable microwave oscillators an eminent embodiment is the one in which circuit arrangements are realized with semiconductor chips and strip leads. The circuit arrangement according to FIG. 8 uses these known possibilities. The arrangement consists of an active circuit element or of two active circuit elements namely a transistor pair denoted by 73 and 74 in the push-pull arrangement according to FIG. 8. The associated supply resistors for the DC supply are denoted by 75, 76, 77 and 78. The supply is effected through different lowpass filters formed in the strip line technique in such a manner that they constitute a high impedance for the oscillator frequencies and load the two emitters capacitively. A strip line configuration 102 together with the capacity diodes operates in the circuit arrangement likewise as the inductors 51 and 52 and the capacitors 53 and 54 of FIG. 6. In addition the strip line configuration 102 may be used as a matching transformer for the load which is denoted by 79 in FIG. 8. A special aspect of this oscillator circuit is that with the aid of an active element or a number of active elements and with the aid of coupled micro-wave lines an oscillator is built up which can be completely integrated and is eminently suitable for mass production. Likewise as described above the reference to the other Figures the capacity diodes 80, 81, and 82, 83 are used which are biassed by a supply source 86 through the resistors 84 and 85. The balanced arrangement of the diodes may alternatively be replaced by a separate diode or by two or more diodes in series. Due to the DC separation of base and tuning circuit isolation capacitors such as the two capacity diodes 71 and 62 according to FIG. 7 are not necessary.

The above-mentioned lowpass filters are denoted by 87, 88 and 89. These likewise lead to the corresponding DC connections 90 and 91 for the emitter voltage of the transistors and the low-pass filter 88 through the resistors 77 and 78 operating as a potential divider to a supply terminal 92 for the base voltage of the transistors 73 and 74.

Figure 9:
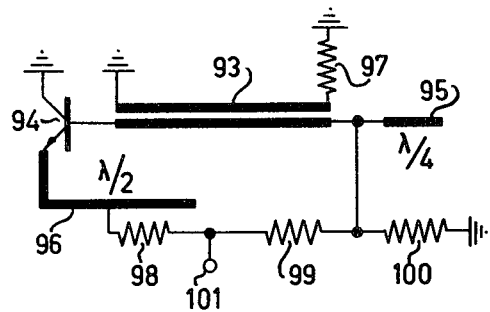
FIG. 9 shows an embodiment of the fixed oscillator with a single oscillator and micro-strip leads.

FIG. 9 shows an embodiment of a fixed single oscillator realizing the principle of connecting in a very simple manner a negative resistance element to a resonator or a tunable transformer and coupling it with a load. All elements used can be completely integrated or can be formed as a strip line structure in a bidimensional way. The resonator and the transformer are denoted in the embodiment of FIG. 9 by 93 and the associated amplification transistor is denoted by 94. The base lead of the amplifier element 94, i.e. of the transistor incorporates a $\lambda/4$ lead 95 constituting a complete shortcircuit for a frequency, notably the oscillation frequency so that the resonator is effectively earthed on this side. Furthermore a $\lambda/2$ structure 96 is present on the emitter of the amplifier element 94 which structure constitutes a high impedance for the same frequency and substantially replaces a choke which should normally be arranged at this point. The coupling structure 93 behaves as an inductor parallel to a transformer and a load resistor.

Together with the input capacitance of a transistor this structure constitutes the resonator and simultaneously the load while a special resistor 97 is shown as a load and the other resistors 98, 99 and 100 serve as supply resistors for adjusting the relevant biasses of the amplifier element 94 and are connected to a common voltage supply source 101.

The special aspect of the oscillator according to FIG. 9 is that so-called coupled micro-strip lines are used. They may be formed on an $Al_2O_3$ substrate creating the possibility of influencing, i.e. improving the drift properties of the total oscillator by means of the known temperature dependency of this material.

What is claimed is:

1. A circuit arrangement for tuning both VHF and UHF television signals between upper and lower frequency limits, said circuit comprising a first mixer stage having a first input means for receiving said television signals, a second input, and an output means for providing a signal at a first intermediate frequency which is higher than twice said upper frequency limit; a first oscillator coupled to said second input and tunable in a range below said first intermediate frequency; a gyromagnetic filter tuned to said first intermediate frequency and having an input coupled to said first mixer output and an output; a second mixer stage having a first input coupled to said filter output, a second input, and an output means for providing a signal at a second intermediate frequency lower than said lower frequency limit; and a second oscillator coupled to said second mixer second input and fixed tuned to a frequency above said first intermediate frequency.

2. A circuit arrangement as claimed in claim 1, wherein each of the two mixer stages comprises a double balanced diode circuit.

3. A circuit arrangement as claimed in claim 1, further comprising a first hybrid ring coupled to the first mixer stage, the first tunable oscillator, and the input of the gyromagnetic filter; and a second hybrid ring coupled to the second mixer stage, the second fixed frequency oscillator, and the output of the filter.

4. A circuit arrangement as claimed in claim 3, wherein the hybrid rings are each formed in a microstrip technique and each have a circumference of 6/4 $\lambda$ and four taps, two of said taps being $\lambda/2$ apart and coupled to the respective Mixer stage, one being coupled at half the distance $\lambda/4$ therebetween to the gyromagnetic filter and one being coupled at a distance of $\lambda/4$ relative to one tap and $¾ \lambda$ relative to the other of the said taps to the tunable oscillator and to the fixed frequency oscillator, respectively.

5. A circuit arrangement as claimed in claim 4, wherein each hybrid ring comprises lead circuits folded in a meander-shaped manner.

6. A circuit arrangement as claimed in claim 4, wherein each lead section of a hybrid ring comprises a $\pi$ or T element of concentrated inductors and capacitors or of high resistive and low resistive lead sections.

7. A circuit arrangement as claimed in claim 2, further comprising a broadband amplifier having an input means for receiving said television signals and a symmetrical output and wherein the first mixer stage comprises at least four annular and electrically coupled diodes, the diode ring thus obtained has four connection terminals, a low pass filter coupled to two opposed terminals and to the symmetrical output of the input broadband amplifier and the two remaining terminals are coupled to the first hybrid ring.

8. A circuit arrangement as claimed in claim 2, further comprising means for amplifying said second intermediate frequency signal having a symmetrical input, and wherein the second mixer stage comprises at least four annular and electrically coupled diodes and that the diode ring thus obtained has four connection terminals, two of said terminals opposing each other, an absorption circuit for the first intermediate frequency and for the fixed oscillator frequency coupled to said two opposing terminals and to the symmetrical input of the second intermediate frequency amplifier and the two remaining terminals are coupled to the second hybrid ring.

9. A circuit arrangement as claimed in claim 7, wherein the diode ring comprises eight diodes, two of said diodes being arranged in series with equal polarity into each branch.

10. a circuit arrangement as claimed in claim 9, wherein each branch comprises a resistor in series with the two diodes.

11. A circuit arrangement as claimed in claim 1, wherein the tunable oscillator comprises a transistorized push-pull oscillator oscillating at the half of the desired frequency and having variable capacity tuning diodes and means for symmetrically providing output at the second harmonic.

12. A circuit arrangement as claimed in claim 11, wherein the emitter circuits of the transistors include coils having parasitic capacitance.

13. A circuit arrangement as claimed in claim 11 further comprising capacity diodes biassed by the base potential and used for DC separating transistor-and capacity-diode-potentials are coupled in the base supply lead of the transistors.

14. A circuit arrangement as claimed in claim 1, wherein said first oscillator comprises transistors, a tuning circuit, and means for coupling the tuning circuit with the transistors comprising coupled microstrip lines.

15. A circuit arrangement as claimed in claim 1, wherein the second fixed oscillator comprises a transistorized basic wave oscillator having coupled microstrip lines means for the frequency adjustment and for coupling the load.

16. A circuit as claimed in claim 1 wherein said filter comprises a YIG filter.

17. A circuit as claimed in claim 1 further comprising a preamplifier means for amplifying signals between said frequency limits and having an input means for receiving said signals and an output coupled to said first mixer first input.

18. A circuit as claimed in claim 8 wherein the diode ring comprises eight diodes, two of said diodes being arranged in series in with each polarity into each branch.

19. A circuit as claimed in claim 18, wherein each branch comprises a resistor in series with the two diodes.

20. A circuit arrangement for tuning both VHF and UHF television signals between upper and lower frequency limits, said circuit comprising a first mixer stage having a first input means for receiving said television signals, a second input, and an output means for providing a signal at a first intermediate frequency which is higher than said upper frequency limit; a first oscillator coupled to said second input; a gyromagnetic filter tuned to said first intermediate frequency and having an input coupled to said first mixer output and an output; a second mixer stage having a first input coupled to said filter output, a second input, and an output means for providing a signal at a second intermediate frequency lower than said lower frequency limit; and a second oscillator coupled to said second mixer second input, at least one of said mixers comprising a diode ring having eight diodes, each leg having two series coupled diodes with equal polarity.

* * * * *